(12) United States Patent  (10) Patent No.: US 7,989,768 B2
Ikegami et al.  (45) Date of Patent: Aug. 2, 2011

(54) SCANNING ELECTRON MICROSCOPE

(75) Inventors: Akira Ikegami, Suita (JP); Minoru Yamazaki, Hitachinaka (JP); Hideyuki Kazumi, Hitachinaka (JP); Koichiro Takeuchi, Hitachinaka (JP); Hisaya Murakoshi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 376 days.

(21) Appl. No.: 12/188,870

(22) Filed: Aug. 8, 2008

(65) Prior Publication Data

US 2009/0039264 A1 Feb. 12, 2009

(30) Foreign Application Priority Data

Aug. 9, 2007 (JP) ................ 2007-207342

(51) Int. Cl.
*H01J 37/26* (2006.01)
*H01J 37/28* (2006.01)

(52) U.S. Cl. ..... 250/311; 250/306; 250/310; 250/396 R; 430/296; 702/27; 702/28

(58) Field of Classification Search ............ 250/306, 250/307, 309, 310, 311; 430/296, 297, 298; 702/27, 28
See application file for complete search history.

(56) References Cited

U.S. PATENT DOCUMENTS

| | | |
|---|---|---|
| 6,521,891 B1 | 2/2003 | Dotan et al. |
| 2002/0027440 A1* | 3/2002 | Shinada et al. ............ 324/751 |
| 2004/0113074 A1* | 6/2004 | Suzuki et al. .............. 250/310 |
| 2004/0124364 A1* | 7/2004 | Sato et al. ............. 250/396 R |
| 2006/0011835 A1* | 1/2006 | Murakoshi et al. ......... 250/310 |
| 2007/0023658 A1* | 2/2007 | Nozoe et al. .............. 250/310 |

FOREIGN PATENT DOCUMENTS

| | | |
|---|---|---|
| JP | 01-214769 | 8/1989 |
| JP | 07-288096 | 10/1995 |

* cited by examiner

*Primary Examiner* — Robert Kim
*Assistant Examiner* — Nicole Ippolito Rausch
(74) *Attorney, Agent, or Firm* — McDermott Will & Emery LLP

(57) ABSTRACT

A scanning electron microscope having a charged particle beam that when in a state being irradiated toward a sample, a voltage is applied to the sample so that the charged particle beam does not reach the sample. The scanning electron microscope also detects information on a potential of a sample using a signal obtained, and a device for automatically adjusting conditions based on the result of measuring.

6 Claims, 10 Drawing Sheets

THE ARRIVAL POINT OF THE PRIMARY ELECTRON WITH A LARGE OPEN ANGLE IS OFFSET AT THE DETECTOR

SCANNING ELECTRON MICROSCOPE

BACKGROUND OF THE INVENTION

1. Field of the Invention

The purpose of the present invention is to provide a charged particle beam device suitable for reducing focus offset, magnification fluctuation and measurement length error in the charged particle beam device caused by charging on a sample.

2. Description of the Related Art

Recently, as semi-conductor devices, particularly, progress, measuring and inspecting technique of a semi-conductor is more and more increasing its importance. A scanning electron microscope represented by a CD-SEM (Critical Dimension-Scanning Electron Microscope) is a device for measuring the pattern formed on a semi-conductor device by scanning an electron beam on a sample and detecting electrons such as secondary electrons or the like emitted from the sample. In such a device, although the condition of the device is required to be appropriately set to carry out highly accurate measurement and inspection, among recent devices, there are samples wherein the charge adheres by irradiation of an electron beam or influence of a semi-conductor process. Insulator samples such as resist, insulating film, low-k material and the like, in particular, are known as the samples to which the charge is liable to adhere.

Following methods are conventionally devised as methods for measurement of a charging potential. In Japanese Unexamined Patent Application Publication (JP-A) No. 7-288096, a method is disclosed wherein an electron beam is converged on a sample, the electron beam is scanned on the sample, a "reflecting electron" signal obtained according to irradiation of the beam is detected by a detector, an amount of variation of the detected signal in a predetermined time is determined, and either of the pressure around the sample, irradiation amount of the electron beam, and the acceleration voltage of the electron beam is controlled based on the amount of variation obtained (conventional technique 1). Also, a controlling method wherein charging is detected and feed-back is applied based on it is disclosed in the U.S. Pat. No. 6,521,891 (conventional technique 2). According to it, an electron beam is scanned on a sample, a secondary electron and a backscattering electron are detected and an image is formed. The image is obtained by varying accelerating energy of the electron beam, and accelerating energy of the electron beam is varied based on the result of analysis of the image, thereby compensation of charging of the sample is pursued. On the other hand, a method is exhibited in the gazette for the JP-A-1-214769 wherein non-contact measuring of a potential of a sample is performed. A metal needle having a sharpened tip, a feed-back circuit for detecting a field emission current or a tunnel current through the metal needle and to apply a voltage to the metal needle so that the current becomes constant, and a circuit for reading out the metal needle voltage are provided (conventional technique 3).
(Patent Document 1) JP-A-7-288096
(Patent Document 2) U.S. Pat. No. 6,521,891
(Patent Document 3) JP-A-1-214769

SUMMARY OF THE INVENTION

Although both of the techniques described in the patent documents 1 and 2 relate to the technique wherein a charged amount on a sample is measured and conditions of a device are adjusted based on the measurement, because the charged amount is measured by detecting a signal obtained according to irradiation of an electron beam to the sample, charging is forcibly induced by irradiation of the electron beam, and a problem that measurement of the charged amount prior to irradiation of the electron beam is difficult is involved.

On the other hand, according to the technique described in the patent document 3, although measurement of a potential of the sample surface is possible without inducing charging by an electron beam, there are problem that it takes time to make the metal needle get close to a sample, and problems of change of a potential of the sample by making the metal needle get close to the sample and discharging in the case charge amount is large.

The purpose of the present invention is to provide a device for measuring a potential of a charge of a sample adhering by irradiation of a charged particle beam or by influence of a semi-conductor process without irradiation of an electron beam to the sample, and automatically compensating for the conditions (magnification, focus, observation coordinates) of the device which vary according to charge of the sample.

To achieve the purpose described above, the present invention provides a device for measuring a potential of a sample using a signal obtained under a state a voltage is applied to the sample so that a charged particle beam does not reach the sample (hereafter such state may be referred to also as a mirror state) while the charged particle beam is irradiated toward the sample, and automatically compensating the conditions of the device (magnification, focus, observation coordinates) which vary according to charge of the sample.

A specific method will be described below. The means in accordance with the present invention consists of two steps described below.

1. A Step For Measuring a Potential

Under the mirror state where a primary electron beam is not incident on a sample, optical parameters (an object point ZC for an objective lens, exciting current of the objective lens $I_{obj}$, a potential of the sample $V_s = V_r + \Delta V_s$, a potential of a booster $V_b$) are set to optional values, and a displacement amount (the arrival point of orbit H on a detector) or a magnification (the arrival point of orbit G on the detector) is measured, thereby the potential of the sample is calculated. The detecting method of a displacement amount and a magnification will be exhibited below.

In measuring a displacement amount and a magnification of a mirror electron at the detector position, it is preferable to use a detector with a plurality of detecting elements spreading two-dimensionally. The arrival position or distribution of the mirror electron is obtained based on the output signal of the plurality of detecting elements, thereby it becomes possible to obtain the deviation from the reference value.

Further, if a deviation amount is arranged to be detected using an image, the deviation amount can be detected more easily. While the mirror electron is reflected right above the sample and passes through a lens system, it is subjected to influence of a passage of the beam and a structure. To obtain the image, the position of the incident beam may be scanned. Thus, the shape of the structure in the path of the beam is formed as an image. By measuring the size of the structure shape transferred into the image and the sag of an edge, the displacement amount and the magnification can be measured.

As an example of deriving a potential of a sample from the displacement amount and the magnification detected as above, relation between the retarding potential $V_r$ and the displacement amount is shown in FIG. 2. The curve A in the drawing was obtained as $I_{obj}$ was fixed to an optional value ($I_{obj1}$) when the potential by charging $\Delta V_s = 0$ V. When charging occurs in a sample, a potential of a sample $V_s$ can be represented by a total of a retarding potential $V_r$ and a potential by charging $\Delta V_s$, therefore the curve of the displacement amount with respect to the retarding potential shifts by $\Delta V_s$. Consequently, if the retarding potential $V_r$ where the displacement amount becomes 0 on the detector is obtained, the charging potential $\Delta V_s$ can be derived by referring to the displacement amount curve A. Further, by measuring the displacement amounts at two or more kinds of retarding potential $V_r$ and estimating the shifting amount of the curve A, the charging potential $\Delta V_s$ can be estimated.

Here, if the value $I_{obj}$ is set low (high), the focusing potential of the sample becomes high (low) and the position $Z_m$ (mirror surface) where the irradiated electron is reflected becomes low (high). Therefore, to improve spatial resolution of measurement of a potential, focus can be adjusted with the value $I_{obj}$ being set low and with the mirror surface being made close to the sample.

Further, if a potential is measured with the set value of $I_{obj}$ changing, measuring of the potential distribution $V_{axis}$ on the light axis (Z) is possible as well.

2. A Step for Automatically Compensating the Conditions of the Device (Focus, Magnification, Observation Coordinates)

If a wafer is not charged, exciting current of the objective lens required for focusing is generally represented by a function shown in the equation (1).

$$I_{obj}=F(V_o,V_r,Z) \quad (1)$$

where, $I_{obj}$ is the exciting current of the objective lens when the wafer is not charged, F is the function for calculating the exciting current of the objective lens, $V_r$ is the retarding potential applied to the wafer, and Z is the height of the wafer. The function F can be derived by optical simulation or actual measurement. Because the potential of the wafer which is not charged is generally of the same potential with the retarding potential applied to the wafer and satisfies the equation (1), the regular focus control is possible. However, the exciting current of the objective lens required when the wafer itself is charged is as shown in the equation (2), therefore, the focus current is different in the charged case and the non-charged case.

$$I'_{obj}=F(V_o,V_s,Z) \quad (2)$$

$V_s$ is a potential of a sample and can be represented as a total of a retarding potential $V_r$ applied to a wafer and the charging potential $\Delta V_s$.

Consequently, even if the height is detected accurately, the focus cannot be adjusted, therefore, the secondary charged particle image is blurred.

Then, if the potential of the sample $V_s(=V_r+\Delta V_s)$ is measured by the method as described in 1 and observation is performed using the exciting current $I'_{obj}$ obtainable by the equation (2), focus control becomes possible even when the wafer is charged.

Although the example described above is the method of feedback of the result of the measurement of the potential to the exciting current, focus control by feedback of the potential of the sample $V_s$ obtained by measurement of the potential to the retarding potential $V_r$ is also possible.

Besides, in other case of a SEM using what is called a boosting method wherein a cylindrical electrode applied with a positive potential is disposed within an objective lens, focus control is possible by adjusting the positive potential $V_b$ applied. Furthermore, other general techniques for adjusting the focus of an electron beam are applicable.

The case the present invention is applied to magnification control of a SEM will be described.

If the potential of a sample varies by charging, the magnification of a scanning electron microscope varies. When a primary electron beam emitted radially from one point of a crossover plane concentrates to one point of a sample surface, if an imaginable emitting point of the primary beam shifts by one unit distance, the imaginable arrival point onto the sample surface shifts by $M_{obj}$ unit distance. When the conversion coefficient and the coil current of a scanning deflector are represented by K and $I_{scan}$ respectively, the distance between two points on the sample can be calculated by the following equation.

$$A=K \cdot M_{obj} \cdot I_{scan} \quad (3)$$

Also, $M_{obj}$ can be represented by the following equation.

$$M_{obj}=M(V_o,V_r,S_{charge},\Delta V_s) \quad (4)$$

where, $S_{charge}$ is the area of a charged region.

With regard to magnification variation too, if the function $M_{obj}$ has been derived from optical simulation or an experiment, input current $I_{scan}$ of a deflecting coil with A being made constant can be obtained by the equation (3).

As a third application, image drift control and magnification control occurring in observation utilizing preliminary charging can be cited.

In observing a contact hole with a high aspect ratio, a phenomenon that the bottom of the contact hole cannot be seen occurs. Then, a technique is disclosed in the JP-A-5-151927 wherein positive charging is created on the surface of a sample by irradiation of an electron beam at a low magnification beforehand, a secondary electron discharged from the bottom of the contact hole is elevated by an elevating electric field formed between the bottom of the contact hole and the surface of the sample, thereby observation of the bottom of the hole is performed. However, because of a potential gradient generated in the preliminary charging, problems such as magnification fluctuation, drift, or the like occur. An explanatory drawing of the mechanism of occurrence of drift of an image is exhibited in FIG. 9.

The charged region (generally, having a size of several tens of μm to several hundreds of μm on one side) formed by the preliminary charging is shown at A in FIG. 9. If a positive charge is accumulated evenly over the region, the potential distribution with the center part being highest as shown in the lower portion of FIG. 9 is formed. When observed (one side of the region of observation is several hundreds of nm to several μm) after formation of such potential distribution, the primary electron beam is subjected to a force from the potential gradient by the preliminary charging and is forcibly deflected. As a result, an area different from that of the original area desired is forcibly observed.

If the technique in accordance with the present invention is used, the distribution of the charging potential can be measured with high spatial resolution without irradiation of the primary electron beam onto the sample. Consequently, the present invention can be applied to measuring the potential gradient of the observation region prior to observation. If observation coordinates is compensated based on the result of measurement of the potential gradient, the desired observation region can be observed. Further, as is exhibited in FIG. 10, the influence of drift of an image by charging is inhibited and the bottom of the contact hole with a high aspect ratio becomes possible to be observed by performing the preliminary irradiation again to eliminate the potential gradient of the observation region. This method is effective not only for observation of the bottom of the contact hole but also for general technique wherein observation is performed after preliminary charging.

According to the constitution described above, observation of the sample inhibiting the influence of charging by irradiation of an electron beam is possible, because the potential of the sample is detected from the information obtained under the state the charged particle beam is not incident on the sample and optical conditions are controlled.

BRIEF DESCRIPTION OF THE DRAWINGS

Embodiment(s) of the present invention will be described in detail based on the following figures, wherein.

DESCRIPTION OF THE PREFERRED EMBODIMENTS

The position of a detector appropriate for implementing the present invention will be described.

To improve the spatial resolution of measurement of a potential in accordance with the present invention, two conditions described below should be satisfied.

A mirror surface which is a reflecting surface for the primary electron beam is put near to a sample.

Spreading of the primary electron on the mirror surface is minimized.

Figure 3:
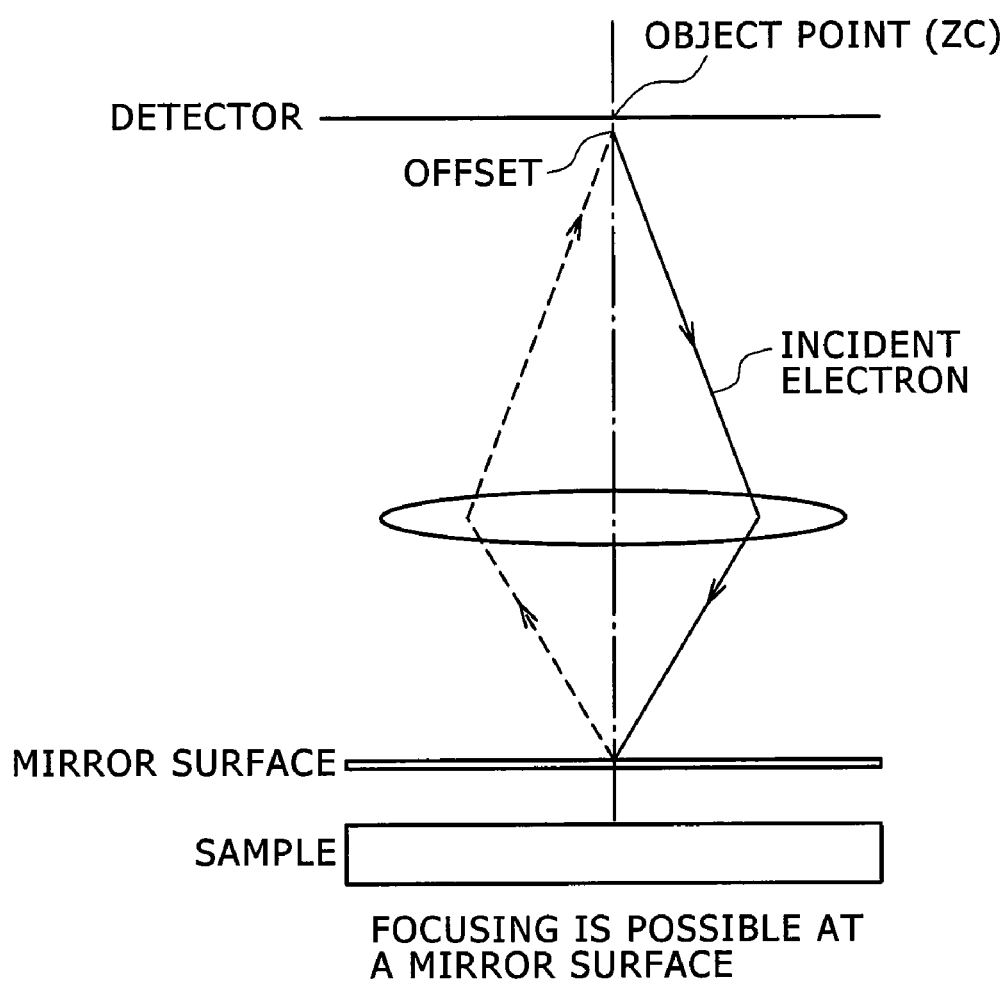
FIG. 3 is an explanatory drawing of the optical condition suitable for measuring a potential with high spatial resolution.

FIG. 3 shows an explanatory drawing of an optical condition (optical condition A) resulting in the highest spatial resolution in measuring a potential utilizing the present invention. In the drawing, ZC is an object point of an objective lens where a detector is positioned. If an arrangement such as shown in FIG. 3 is employed, when focused on the detector, focusing is adjusted on the mirror surface as well. Consequently, in calculating a potential of a sample from the condition with which focus offset is minimized on the detector, if the arrangement exhibited in FIG. 3 is employed, the spatial resolution of measurement of a potential can be improved.

Figure 4:
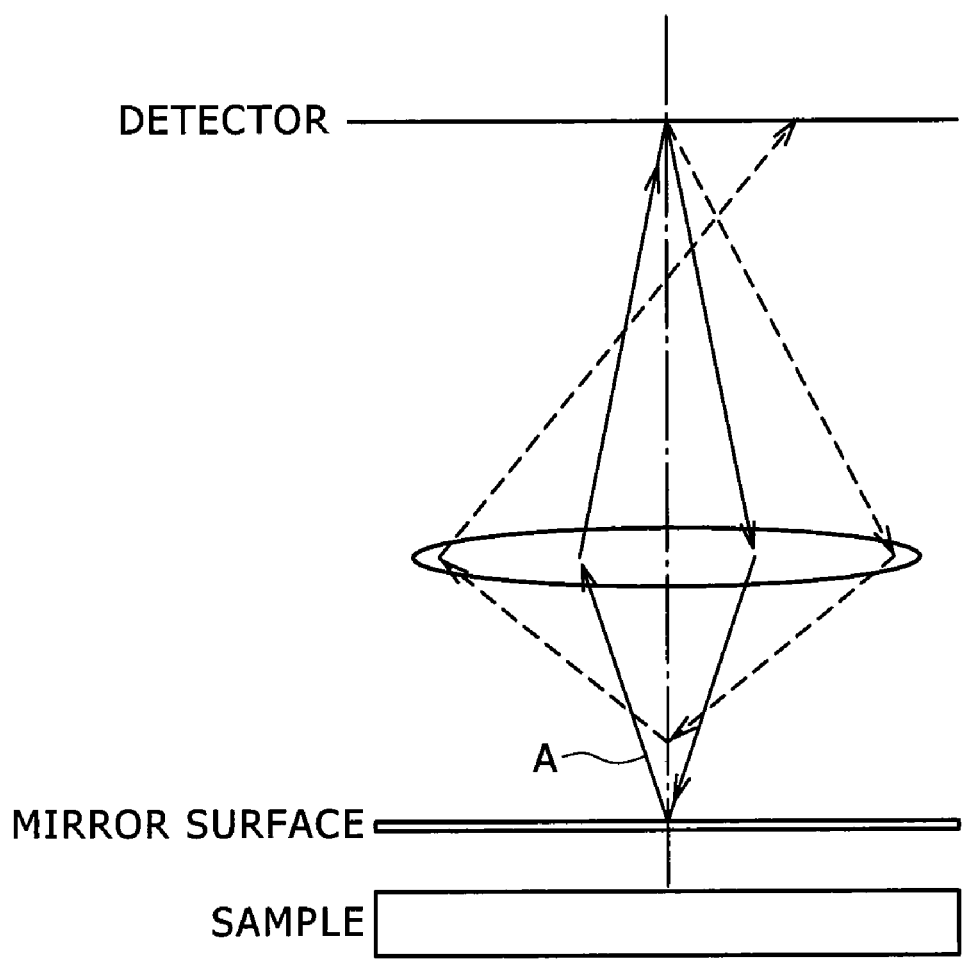
FIG. 4 is an explanatory drawing of focus offset occurring when an opening angle increases.

Here, a displacement amount reflected to the detector by variation of the potential of the sample is proportional to an open angle of the object point (under the case focus offset by aberration is negligible). Therefore, if the open angle at the object point is made large, the detection sensitivity of variation of the potential of the sample improves. However, under the optical condition as exhibited in FIG. 3, velocity in the lateral direction is forcibly generated on the mirror surface. Therefore, as the open angle of the primary beam is larger, the beam is reflected at a position (A in FIG. 4) which is higher than the mirror surface and the focus is offset at the detecting surface. Consequently, even if the open angle is made large and measuring sensitivity of the potential of the sample is improved, the open angle cannot be made large because the focus offset attributable to the open angle as described above occurs.

Figure 5:
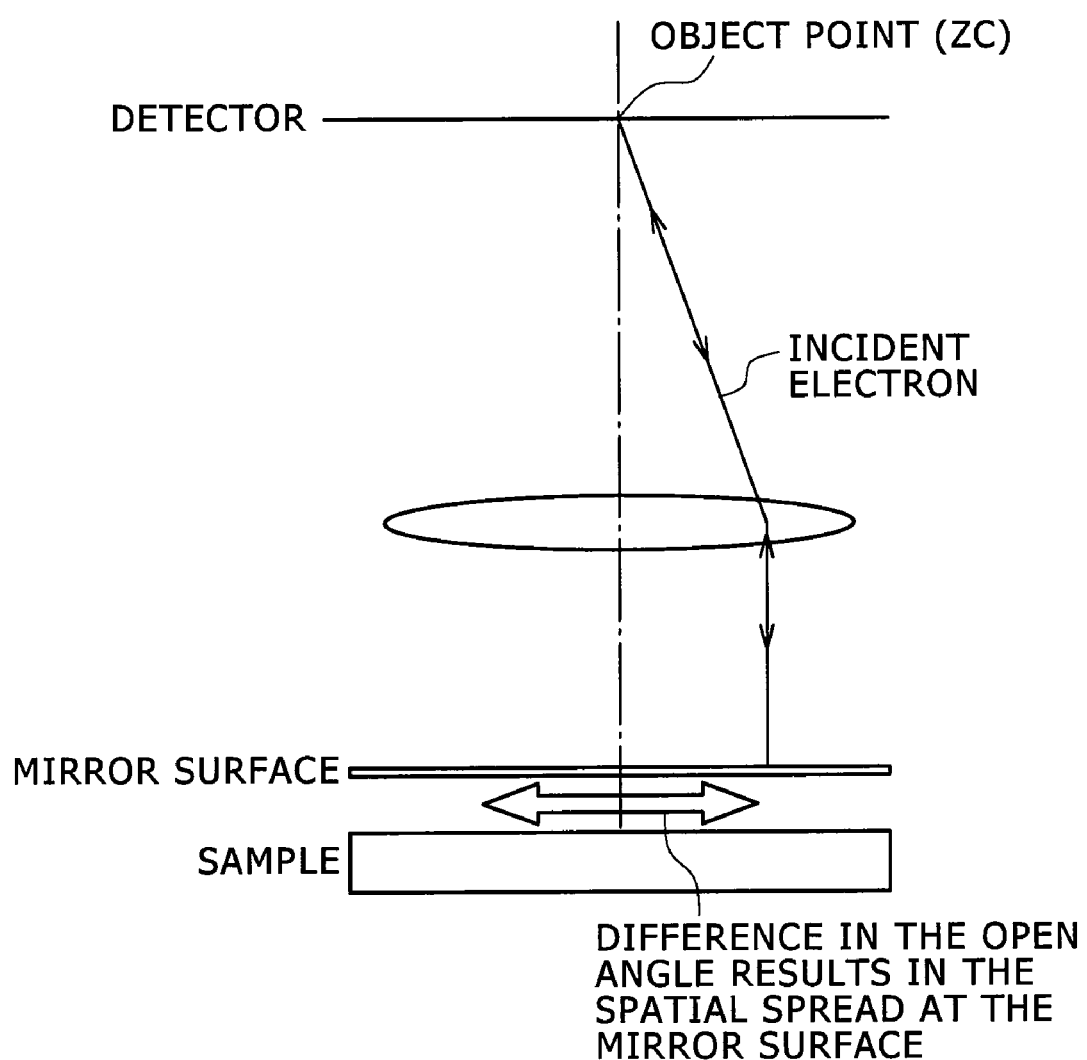
FIG. 5 is an explanatory drawing of an optical condition suitable for measurement of a potential in high accuracy.

To solve the problem described above, an optical condition (optical condition B) as exhibited in FIG. 5 can be employed. ZC in the drawing is a crossover plane where a detector is positioned. Then, the exciting amount of an objective lens is adjusted so that the inclination of the primary electron beam on the mirror surface becomes parallel with the light axis. If the electron beam is irradiated under the condition, any primary electron beam having any angle at the object point is incident perpendicular to the mirror surface, reflected at the potential surface of the same potential, and is converged to the same position on the detector. Therefore, the sensitivity of measuring the potential can be improved because the open angle of the primary electron beam used for measurement can be enlarged. However, because the primary electron beam is widened spatially at the mirror surface, spatial resolution deteriorates. Accordingly, if spatial resolution of measuring a potential is important, the potential can be measured by the optical condition A, and if measuring accuracy for the potential is important, the potential can be measured by the optical condition B. In addition, because the optical condition optimal for measurement of a potential using a mirror electron (specifically, crossover position ZC, booster voltage $V_b$, retarding voltage $V_r$, open angle of crossover plane $\alpha_c$, and deflection fulcrum $Z_p$) and the optical condition optimal for observation do not coincide, it is preferable to measure switching the optical condition used in measurement of the potential and in observation.

In measuring a potential in accordance with the present invention, if the detector is disposed above the deflector, the mirror electron is scanned on the detector by the influence of the deflector. Therefore it is preferable to dispose the detector between the deflector and the objective lens in measuring a potential in accordance with the present invention.

Preferred embodiments in accordance with the present invention will be described below referring to the drawings.

Figure 1:
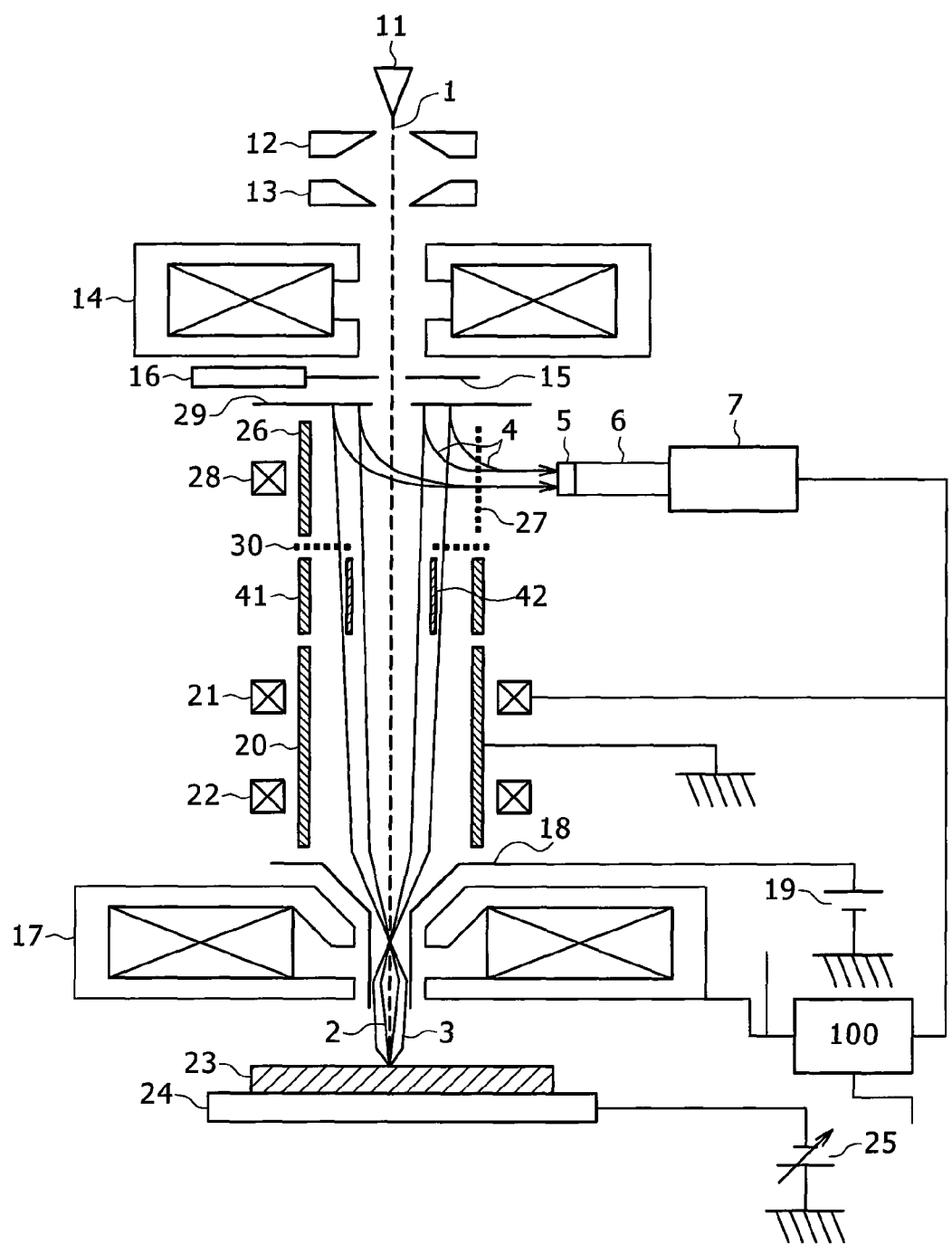
FIG. 1 is an explanatory drawing of the outline of a scanning electron microscope.
Figure 2:
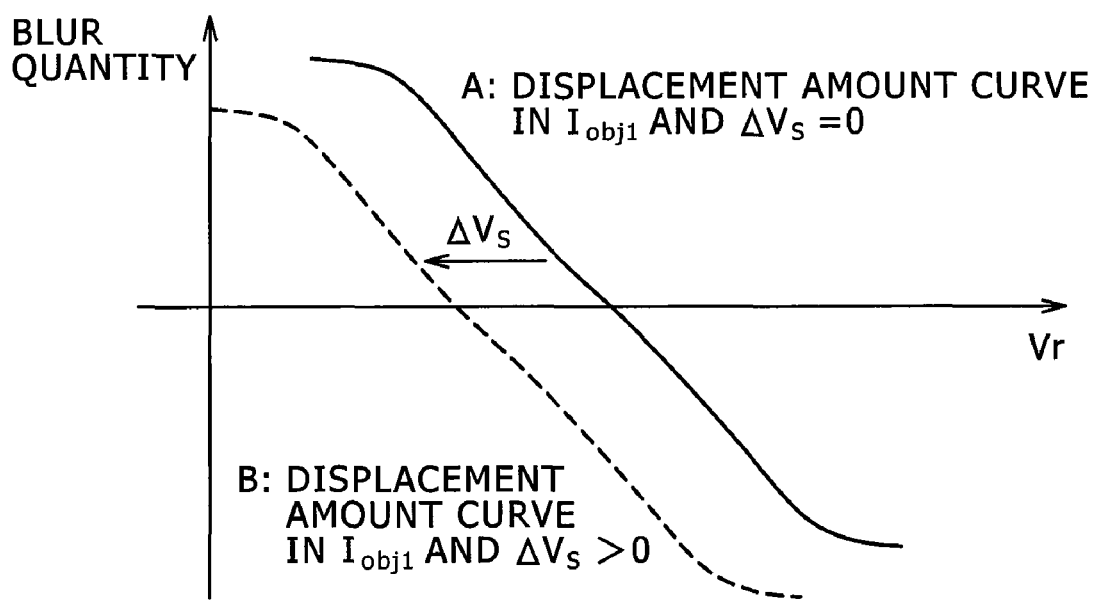
FIG. 2 is an explanatory drawing of a method wherein a potential of a sample is derived from a displacement amount.

FIG. 1 is an explanatory drawing of the outline of a scanning electron microscope. Although the explanation below is made with an example of a scanning electron microscope (SEM) wherein an electron beam is scanned on a sample, the application is by no means limited to it but possibly to other charged particle beam device as well such as a FIB (Focused Ion Beam) device, or the like. However, according to the polarity of the charge of the beam, it is necessary to vary the polarity of the voltage applied to the sample. In addition, FIG. 1 explains only one embodiment of a scanned electron microscope, and the present invention can be applied to the scanned electron microscope with configuration other than that of FIG. 1 in a range within the scope thereof.

In a scanning electron microscope explained in FIG. 1, extraction voltage is applied between the field emission negative electrode 11 and the extraction electrode 12, and the primary electron beam is extracted.

The primary electron beam 1 thus extracted is accelerated by the acceleration electrode 13, and is subjected to converging by the condenser lens 14 and scanning deflection by the upper scanning deflector 21 and the lower scanning deflector 22. The deflection intensity of the upper scanning deflector 21 and the lower scanning deflector 22 has been adjusted to allow two-dimensionally scanning on the sample 23 with the lens center of the objective lens 17 as a fulcrum.

The primary electron beam 1 deflected is further subjected to acceleration by rear stage accelerating voltage 19 in the acceleration cylinder 18 disposed in the passage of the objective lens 17. The primary electron beam 1 rear stage accelerated is converged by lens action of the objective lens 17. The cylindrical electrode 20 is grounded and forms an electric field between the acceleration cylinder 18 for accelerating the primary electron beam 1.

An electron such as the secondary electron emitted from the sample or the backscatter electron is accelerated in the direction opposite the irradiation direction of the primary electron beam 1 by the negative voltage (hereafter referred also to as retarding voltage) applied to the sample and by the electric field formed in the gap with the acceleration cylinder 18, and is detected by the detector 29.

The electron detected by the detector 29 is synchronized with the scanning signal supplied to the scanning deflector and is displayed on an image display device not shown. Also, the image obtained is stored in a frame memory not shown. Further, the current or the voltage supplied or applied to each constituting element of the scanning electron microscope shown in FIG. 1 may be controlled by a control device arranged separate from the main body of the scanning electron microscope.

First Embodiment

A method for measuring a potential of a sample using an electron beam will be described below.

Figure 6:
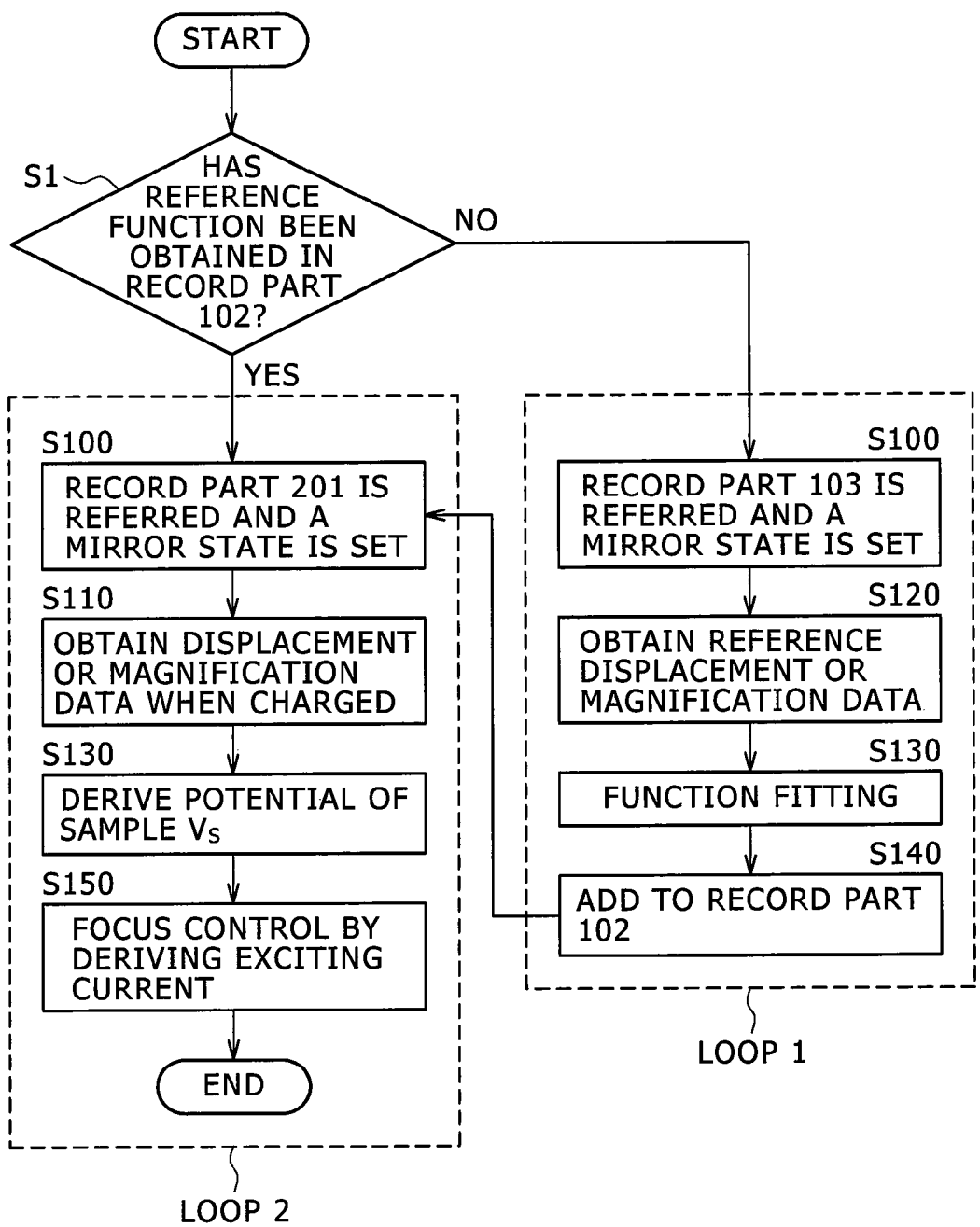
FIG. 6 is a flowchart of the first embodiment in accordance with the present invention (focus control)
Figure 8:
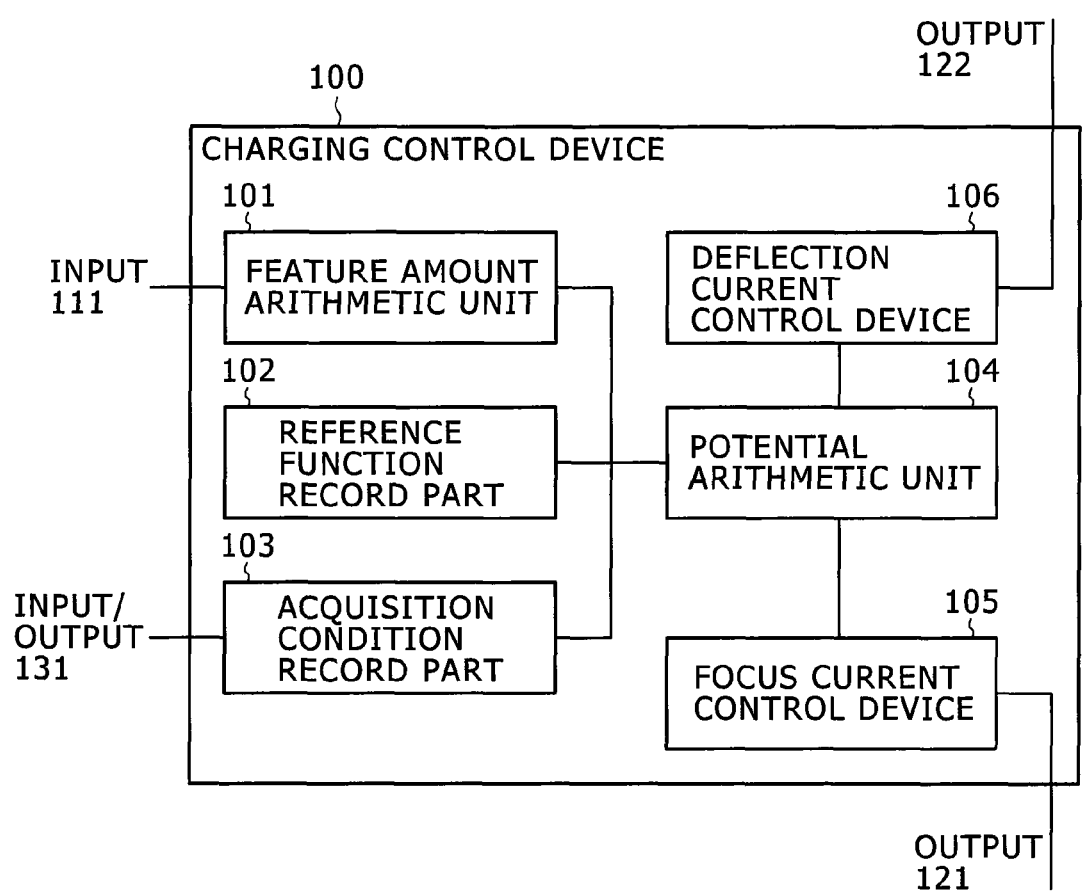
FIG. 8 is a flowchart of the third embodiment in accordance with the present invention (opening angle control)
Figure 9:
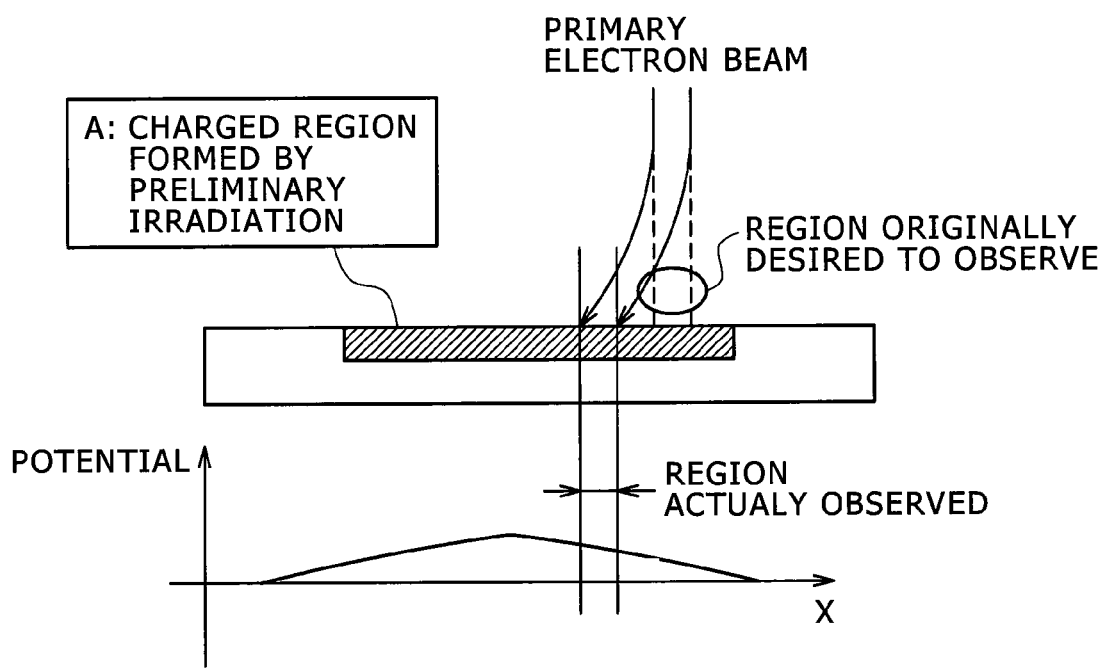
FIG. 9 is a flowchart of the fourth embodiment in accordance with the present invention (deflection fulcrum control)
Figure 10:
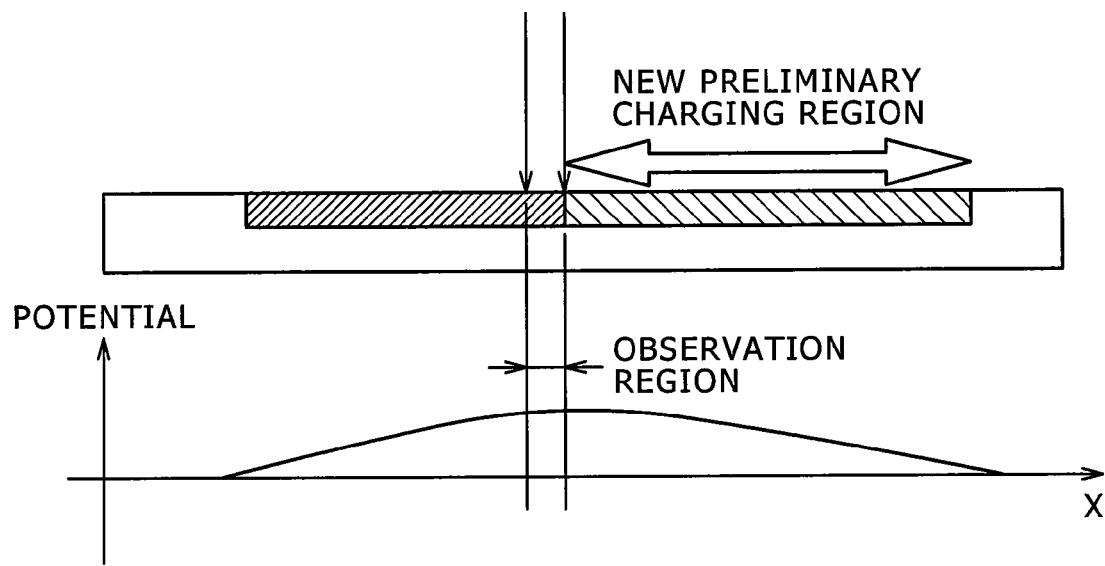
FIG. 10 is an explanatory drawing of an example inhibiting the potential gradient of the observation region by performing preliminary irradiation.

A flowchart of the present embodiment is shown in FIG. 6. Also, an outline of a charging control device is shown in FIG. 8.

In the step S1, judgment is made whether the reference function FR of the acquisition condition to be compensated this time has been stored or not in the reference function record part 102. If there is no reference data required for the compensation this time in the record part 102, the reference sample or the uncharged sample is made a mirror state in the step S100 in the loop 1 with the condition stored in the acquisition condition record part 103 being set, and the displacement amount or the magnification against $V_r$ is detected by a feature amount arithmetic unit 101 in the step S120. The reference function FR obtainable by function fitting using the obtained displacement amount or the magnification is obtained in the step S130, and is stored in the reference function record part 102 in the step S140. When the reference function FR has been obtained in the loop 1 or there already is the reference function FR in the step 1, the acquisition condition is read out from the acquisition condition record part 103 by the step S100 of the loop 2 after charging of the sample, and the mirror state is set. In the step S110, the displacement amount or the magnification is detected against $V_r$ by a plurality of numbers using the feature amount arithmetic unit 101. In the step S130, the potential of the sample $V_s$ is derived from the feature amount and the number of references FM obtained by the potential arithmetic unit 104. In the step S150, the compensated value of the exciting current $I_{obj}$ is calculated based on the potential of the sample obtained using the focus current control device 105, and the exciting amount of the objective lens is adjusted. According to the present invention, the focus control can be performed by measuring the potential of the charged sample by the non-contact electron beam and compensating the exciting current. With this configuration, the focus control in observing an insulated sample can be performed in a short time and without variation in the sample condition.

Though the present embodiment is to derive the potential of the sample using the relation between the retarding potential $V_r$ and the displacement amount or the magnification and to perform the focus control by adjusting the exciting current $I_{obj}$, even if the optical parameters (retarding potential $V_r$ and the exciting current $I_{obj}$) shown above are replaced with other optical parameters, similar effect is expectable.

Second Embodiment

Figure 7:
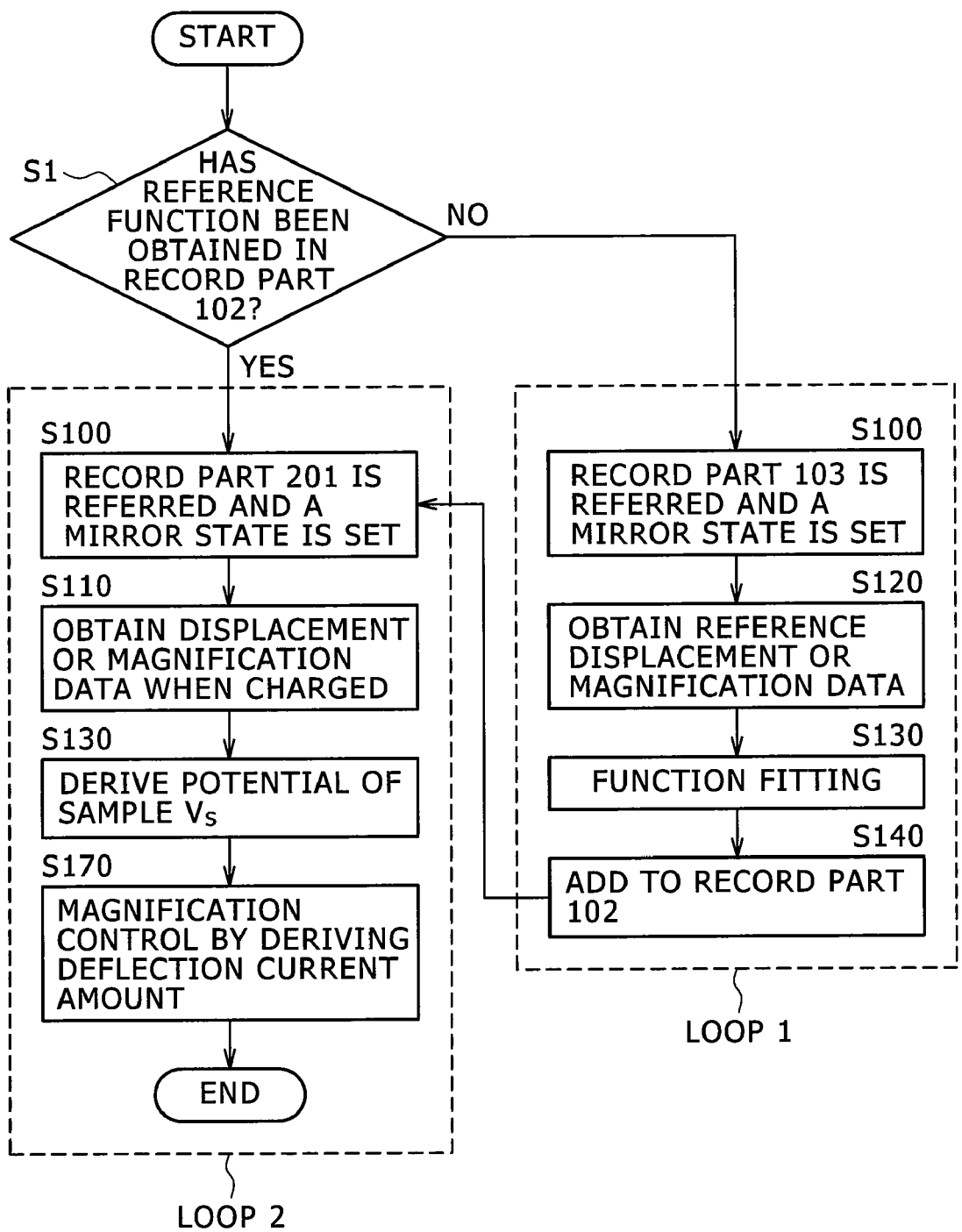
FIG. 7 is a flowchart of the second embodiment in accordance with the present invention (magnification control)

A flowchart of the second embodiment is shown in FIG. 7. Also, an outline of a charging control device is shown in FIG. 8.

In the step S1, judgment is made whether the reference function FR of the acquisition condition to be compensated this time has been stored or not in the reference function record part 102. If there is no reference data required for the compensation this time in the record part 102, the reference sample or the uncharged sample is made a mirror state in the step S100 in the loop 1 with the condition stored in the acquisition condition record part 103 being set, and the displacement amount or the magnification against $V_r$ is detected by a feature amount arithmetic unit 101 in the step S120. The reference function FR obtainable by function fitting using the obtained displacement amount or the magnification is obtained in the step S130, and is stored in the reference function record part 102 in the step S140. When the reference function FR has been obtained in the loop 1 or there already is the reference function FR in the step 1, the acquisition condition is read out from the acquisition condition record part 103 by the step S100 of the loop 2 after charging of the sample, and the mirror state is set. In the step S110, the displacement amount or the magnification is detected against $V_r$ by a plurality of numbers using the feature amount arithmetic unit 101. In the step S130, the potential of the sample $V_s$ is derived from the feature amount and the number of references FM obtained by the potential arithmetic unit 104. In the step S160, the compensated value of the deflection current $I_{scan}$ is calculated based on the potential of the sample obtained using the deflection current control device 105, and the deflection amount is adjusted. According to the present embodiment, the magnification control can be performed by measuring the potential of the charged sample by the non-contact electron beam and compensating the exciting current.

Though the present embodiment is to derive the potential of the sample using the relation between the retarding potential $V_r$ and the displacement amount or the magnification and to perform the magnification control by adjusting the deflection current $I_{scan}$, even if the optical parameters (retarding potential $V_r$) shown above are replaced with other optical parameters, similar effect is expectable.

In addition, feedback to the magnification of the obtained image may be performed.

It should be understood by those skilled in the art that various modifications, combinations, sub-combinations and alterations may occur depending on design requirements and other factors insofar as they are within the scope of the appended claims or the equivalents thereof.

What is claimed is:
1. A scanning electron microscope comprising:
   a deflector for scanning an electron beam;
   a lens for focusing the electron beam;
   a detector for detecting electrons obtained by scanning a sample with the electron beam; and
   a control device for adjusting a negative voltage applied to a sample to control energy of an electron beam reaching the sample, wherein the control device:
   applies the negative voltage to the sample so as to reflect the electron beam without reaching the sample by an electric field formed by the applied negative voltage, detects a deviation from a reference value of a detected signal affected by a structure which exists on a trajectory of the reflected electrons within the scanning electron microscope, without the electron beam reaching the sample, and controls the deflector and/or the lens based on the detected deviation.

2. The scanning electron microscope as set forth in claim 1, wherein, in applying a voltage to the sample, the voltage applied to the sample is adjusted based on the measured potential of the sample.

3. The scanning electron microscope as set forth in claim 1, wherein the detector is composed of a plurality of detecting elements to be arranged two-dimensionally.

4. The scanning electron-microscope as set forth in claim 1, wherein the control device controls the lens so as to change a divergence angle of the electron beam, when the control device detects the deviation.

5. The scanning electron microscope as set forth in claim 1, wherein the control device makes a deflection fulcrum of the deflector vary synchronizing with variation in the negative voltage applied to the sample, when the control device detects the deviation.

6. The scanning electron microscope as set forth in claim 1, wherein the detector is arranged at a cross-over plane of the electron beam.

* * * * *